US008165710B2

(12) United States Patent
Torikoshi et al.

(10) Patent No.: US 8,165,710 B2
(45) Date of Patent: Apr. 24, 2012

(54) POLISHING METHOD, POLISHING APPARATUS, AND PROGRAM FOR CONTROLLING POLISHING APPARATUS

(75) Inventors: Tsuneo Torikoshi, Tokyo (JP); Mitsunori Sugiyama, Tokyo (JP)

(73) Assignee: Ebara Corporation, Tokyo (JP)

( * ) Notice: Subject to any disclaimer, the term of this patent is extended or adjusted under 35 U.S.C. 154(b) by 410 days.

(21) Appl. No.: 12/453,310

(22) Filed: May 6, 2009

(65) Prior Publication Data

US 2010/0015890 A1    Jan. 21, 2010

(30) Foreign Application Priority Data

May 12, 2008   (JP) ................................. 2008-124554

(51) Int. Cl.
*G06F 19/00* (2011.01)
*H01L 21/304* (2006.01)
(52) U.S. Cl. ........ 700/121; 438/691; 438/692; 700/112; 700/160
(58) Field of Classification Search .................. 700/112, 700/121, 160; 156/345.12; 438/692, 691
See application file for complete search history.

(56) References Cited

U.S. PATENT DOCUMENTS

| | | | | |
|---|---|---|---|---|
| 7,262,849 B2* | 8/2007 | Shima et al. | .................. | 356/364 |
| 7,720,562 B2* | 5/2010 | Torikoshi | ...................... | 700/164 |
| 7,822,500 B2* | 10/2010 | Kobayashi et al. | ........... | 700/108 |
| 7,899,570 B2* | 3/2011 | Ortleb et al. | ................... | 700/121 |
| 7,960,188 B2* | 6/2011 | Ohta et al. | ....................... | 438/10 |
| 7,989,348 B2* | 8/2011 | Yamaguchi et al. | .......... | 438/691 |
| 8,010,221 B2* | 8/2011 | Hontake et al. | ............... | 700/121 |
| 2004/0203321 A1 | 10/2004 | Tsuchiyama et al. | | |
| 2005/0142991 A1* | 6/2005 | Nakao et al. | .................... | 451/64 |
| 2005/0236268 A1* | 10/2005 | Mishima et al. | .............. | 204/198 |
| 2007/0049166 A1 | 3/2007 | Yamaguchi et al. | | |

FOREIGN PATENT DOCUMENTS

JP          2003-68689          3/2003

* cited by examiner

*Primary Examiner* — Dave Robertson
(74) *Attorney, Agent, or Firm* — Wenderoth, Lind & Ponack, L.L.P.

(57) ABSTRACT

A polishing method includes: a pre-polishing film thickness measurement step of taking a substrate before polishing out of a cassette and measuring a thickness of a polishing film of the substrate with a film thickness measurement device; the pre-polishing substrate withdrawal step of returning the substrate after the pre-polishing film thickness measurement to the cassette; the polishing step of taking the substrate, which has been returned to the cassette, out of the cassette and polishing the substrate; the cleaning/drying step of cleaning and drying the substrate after polishing; the post-polishing substrate withdrawal step of returning the substrate after cleaning/drying to the cassette; and the post-polishing film thickness measurement step of taking the substrate after cleaning/drying, which has been returned to the cassette, out of the cassette and measuring the thickness of the polishing film of the substrate with the film thickness measurement device.

9 Claims, 9 Drawing Sheets

POLISHING METHOD, POLISHING APPARATUS, AND PROGRAM FOR CONTROLLING POLISHING APPARATUS

BACKGROUND OF THE INVENTION

1. Field of the Invention

The present invention relates to a polishing method and a polishing apparatus for polishing a surface of a substrate, such as a semiconductor wafer, into a flat mirror-like surface, and also relates to a program for controlling the polishing apparatus.

2. Description of the Related Art

A conventionally-known polishing apparatus for polishing a substrate, such as a semiconductor wafer, comprises a polishing section, a cleaning/drying section, a transfer section, a film thickness measurement device, etc. which are unified. It is common practice in such a polishing apparatus to measure a thickness of a polishing film, present in a substrate surface, prior to polishing, and again measure the thickness of the polishing film after polishing the film and cleaning and drying the substrate. This practice is to calculate the polishing performance of the polishing apparatus by comparison of thicknesses of the polishing films before and after polishing, and to feed back the data to polishing of a later substrate.

In many cases, time taken for polishing a polishing film present in a substrate surface (polishing tact time), time taken for cleaning/drying the substrate after polishing (cleaning/drying tact time), and time taken for measuring the thickness of the polishing film (film thickness measurement tact time) generally differ from one another. For example, the time taken for polishing the polishing film and cleaning/drying the substrate after polishing is 60 seconds, while the time taken for measuring the thickness of the polishing film is 90 seconds. In such a case, the time taken for measuring the thickness of the polishing film is a rate-determining factor in the conventional common polishing apparatus in which a sequence of operations for a substrate is carried out successively, and the throughput of the entire polishing apparatus is limited by the film thickness measurement time.

When the time taken for polishing a polishing film present in a substrate surface (polishing step) and cleaning/drying the substrate after polishing (cleaning/drying step) is shorter than the time taken for measuring the thickness of the polishing film, it is conventional practice to carry out the polishing step and the cleaning/drying step each for a predetermined tact time, and cause the substrate after cleaning/drying to stand by for the measurement of the thickness of the polishing film. In such an operating manner, a substrate, which is subject to the feedback control, must be one that is later than the substrate after polishing and cleaning/drying, waiting for the thickness measurement of the polishing film. That is, the substrate, which has undergone the predetermined tact time of polishing and cleaning/drying and is waiting for vacancy in a film thickness measurement device (and which has therefore been taken out of a cassette), is not subject to the feedback control. Therefore, if the substrate after drying, standing by for the thickness measurement of the polishing film, has been poorly polished, e.g., due to a change in the processing environment, the information cannot be reflected until the thickness of the polishing film of the substrate is measured by the film thickness measurement device. Accordingly, a substrate, which has entered into the polishing step during that period, may be poorly polished due to the change in the processing environment. In order to perform the feedback control early so as to early reflect a change in the polishing step in later substrates, it is necessary to shorten the film measurement tact time as much as possible.

It is also conventional practice in polishing of substrates to carry out a sequence of process steps: pre-polishing film thickness measurement step→polishing step→cleaning step→drying step→post-polishing film thickness measurement step, successively for each substrate. In this case, when the last post-polishing film thickness measurement step of the process is a rate-determining step, the upstream steps (pre-polishing film thickness measurement step, polishing step, cleaning step and drying step) must be waited for until completion of the post-polishing film thickness measurement step. Therefore, there will be a substrate which, after completion of the drying step, is standing by on a drying device and a substrate which, after completion of the cleaning step, is standing by on a cleaning device. In this case, a substrate after the polishing step cannot enter the cleaning device. Interconnects (e.g., copper interconnects) formed in a surface of a substrate, such as a semiconductor wafer, can therefore corrode after polishing, which may increase the resistance of the interconnects and provide a defective product.

Substrates, such as semiconductor wafers, are generally managed with a cassette, in which a plurality of substrates are housed, as a lot. All the process steps for all the substrates of one lot are not completed even when polishing and cleaning/drying of the last substrate of the lot is completed if the measurement of a thickness of a polishing film of the last substrate is not completed. Therefore, there is downtime of a polishing section during a lot change period from the termination of the polishing step for the last substrate of one lot to the initiation of polishing for the first substrate of the next lot. For the purposes of maintaining polishing environment, etc., polishing of a dummy wafer or the like in the polishing section is generally practiced during such downtime. However, polishing a dummy wafer or the like in every lot change period leads to an increased cost.

SUMMARY OF THE INVENTION

The present invention has been made in view of the above situation. It is therefore an object of the present invention to provide a polishing method and a polishing apparatus which can reduce the waiting time of a substrate after polishing, standing by for measurement of a thickness of a polishing film, thereby increasing the throughput of the entire apparatus, and which can securely perform feedback control, and to provide a program for controlling the polishing apparatus.

The present invention provides a polishing method comprising: a pre-polishing film thickness measurement step of taking a substrate before polishing out of a cassette and measuring a thickness of a polishing film of the substrate with a film thickness measurement device; a pre-polishing substrate withdrawal step of returning the substrate after the pre-polishing film thickness measurement to the cassette; a polishing step of taking the substrate, which has been returned to the cassette, out of the cassette and polishing the substrate; a cleaning/drying step of cleaning and drying the substrate after polishing; a post-polishing substrate withdrawal step of returning the substrate after cleaning/drying to the cassette; and a post-polishing film thickness measurement step of taking the substrate after cleaning/drying, which has been returned to the cassette, out of the cassette and measuring the thickness of the polishing film of the substrate with the film thickness measurement device.

According to the polishing method of the present invention, it becomes possible to carry out the film thickness measurement step for a polishing film of a substrate separately from the polishing step and the cleaning/drying step. This can avoid downtime of a film thickness measurement device during the polishing step or the cleaning/drying step for a substrate for which measurement of the thickness of the polishing film is not needed. Further, the present method can carry out the film thickness measurement for a plurality of substrates separately from and in advance of the polishing step. This can give elbowroom to the film thickness measurement device. In this regard, it is conventional practice to carry out pre-polishing film thickness measurement and post-polishing film thickness measurement alternately. According to the present polishing method, by carrying out pre-polishing film thickness measurement in advance of polishing, it becomes possible to move forward post-polishing film thickness measurement. This can reduce the waiting time of a substrate after polishing, standing by for measurement of a thickness of a polishing film, thereby increasing the throughput of the entire apparatus.

Preferably, the film thickness measurement device preferentially carries out the post-polishing film thickness measurement step when the number of substrates from the pre-polishing film thickness measurement step to the pre-polishing substrate withdrawal step is not less than a predetermined first threshold number. Preferably, when the number of substrates after the cleaning/drying step and before the post-polishing film thickness measurement step is not less than a predetermined second threshold number, the post-polishing substrate withdrawal step for the substrate after the cleaning/drying step for which the post-polishing film thickness measurement step is necessary is stopped.

By preferentially carrying out the post-polishing film thickness measurement depending on the number of substrates which have previously undergone the pre-polishing film thickness measurement, the waiting time of a substrate after polishing, standing by for the measurement of a thickness of a polishing film, can be reduced even to zero. For example, there is a case in which the measurement of a thickness of a polishing film is carried out not for every substrate but for every other substrate. In such a case, the tact time of the pre-polishing film thickness measurement, carried out in parallel with the polishing step, can fully compensate for waiting time for the post-polishing film thickness measurement, enabling smooth operation of the entire apparatus.

The present invention also provides a polishing apparatus comprising: a loading/unloading section having a front loading section to be mounted with a cassette in which substrates are housed; a polishing section having a holder for holding a substrate and pressing the substrate against a polishing surface while moving the substrate relative to the polishing surface, thereby polishing the substrate; a cleaning/drying section for cleaning and drying the substrate after polishing; a film thickness measurement device for measuring a thickness of a polishing film of the substrate before polishing and after polishing and cleaning/drying; and a transfer device for carrying into the cassette a post-film thickness measurement, pre-polishing substrate which has undergone the pre-polishing film thickness measurement and is standing by for polishing in the polishing section, and for carrying into the cassette a post-polishing, pre-film thickness measurement substrate which has undergone the polishing and the cleaning/drying and is standing by for the post-polishing film thickness measurement.

The present invention also provides a program for controlling a polishing apparatus. The program causes a computer to control the polishing apparatus including a loading/unloading section having a front loading section to be mounted with a cassette in which substrates are housed; a polishing section having a holder for holding a substrate and pressing the substrate against a polishing surface while moving the substrate relative to the polishing surface, thereby polishing the substrate; a cleaning/drying section for cleaning and drying the substrate after polishing; a film thickness measurement device for measuring a thickness of a polishing film of the substrate before polishing and after polishing and cleaning/drying; and a transfer device for transferring the substrate. The control causes the polishing apparatus to execute the steps of: carrying into the cassette by the transfer device a post-film thickness measurement, pre-polishing substrate which has undergone the pre-polishing film thickness measurement and is standing by for polishing in the polishing section; and carrying into the cassette by the transfer device a post-polishing, pre-film thickness measurement substrate which has undergone the polishing and the cleaning/drying and is standing by for the post-polishing film thickness measurement.

According to the polishing method and the polishing apparatus of the present invention, it becomes possible to reduce the waiting time of a substrate after polishing, standing by for measurement of a thickness of a polishing film, thereby increasing the throughput of the entire apparatus, and to securely perform feedback control.

DETAILED DESCRIPTION OF THE PREFERRED EMBODIMENTS

Preferred embodiments of the present invention will now be described with reference to the drawings. The following description illustrates the case of polishing a polishing film formed on a surface of a semiconductor wafer, hereinafter referred to simply as a wafer, used as a substrate. It is, of course, possible to use a substrate other than a wafer.

Figure 1:
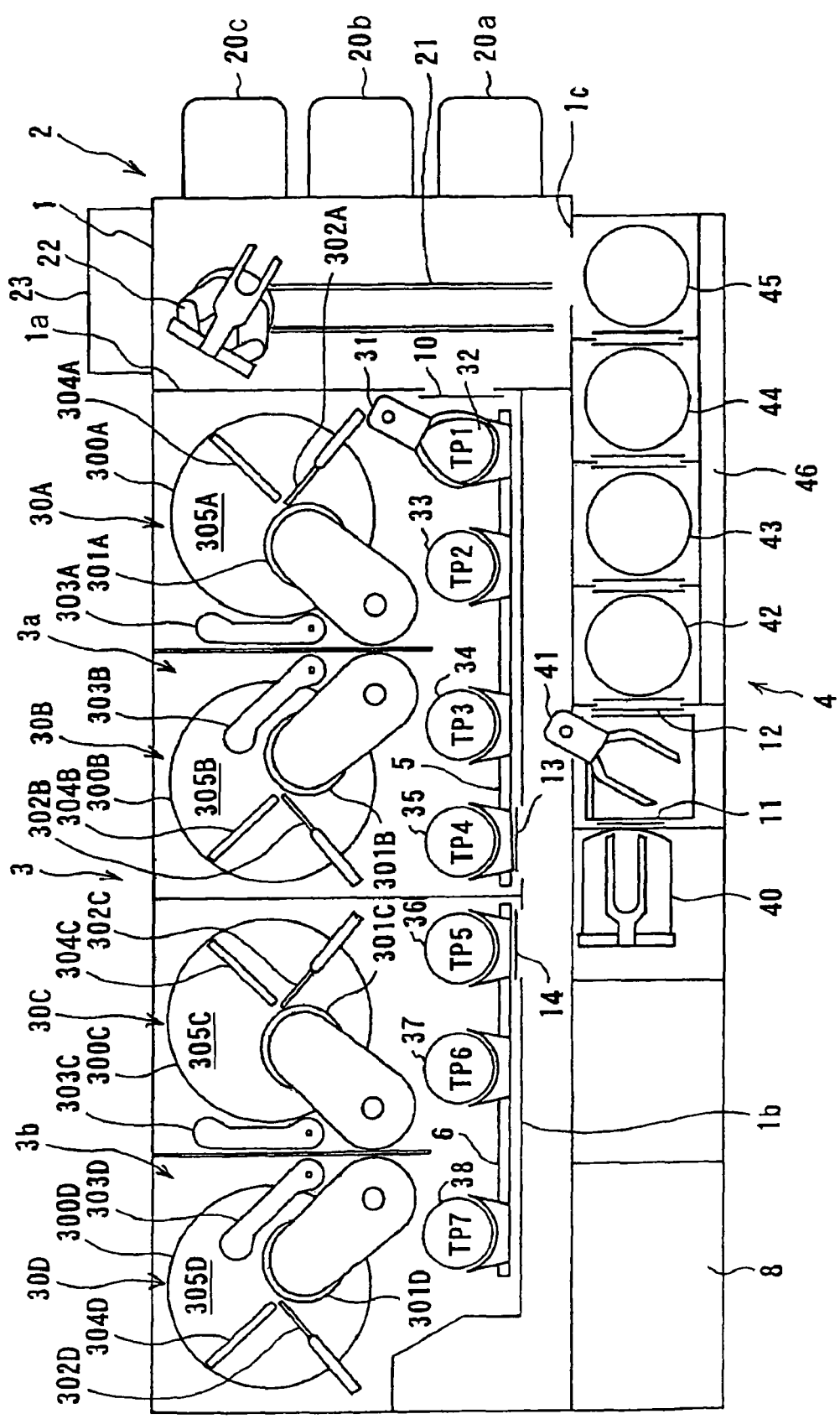
FIG. 1 is a plan view showing the overall construction of a polishing apparatus according to an embodiment of the present invention.
Figure 2:
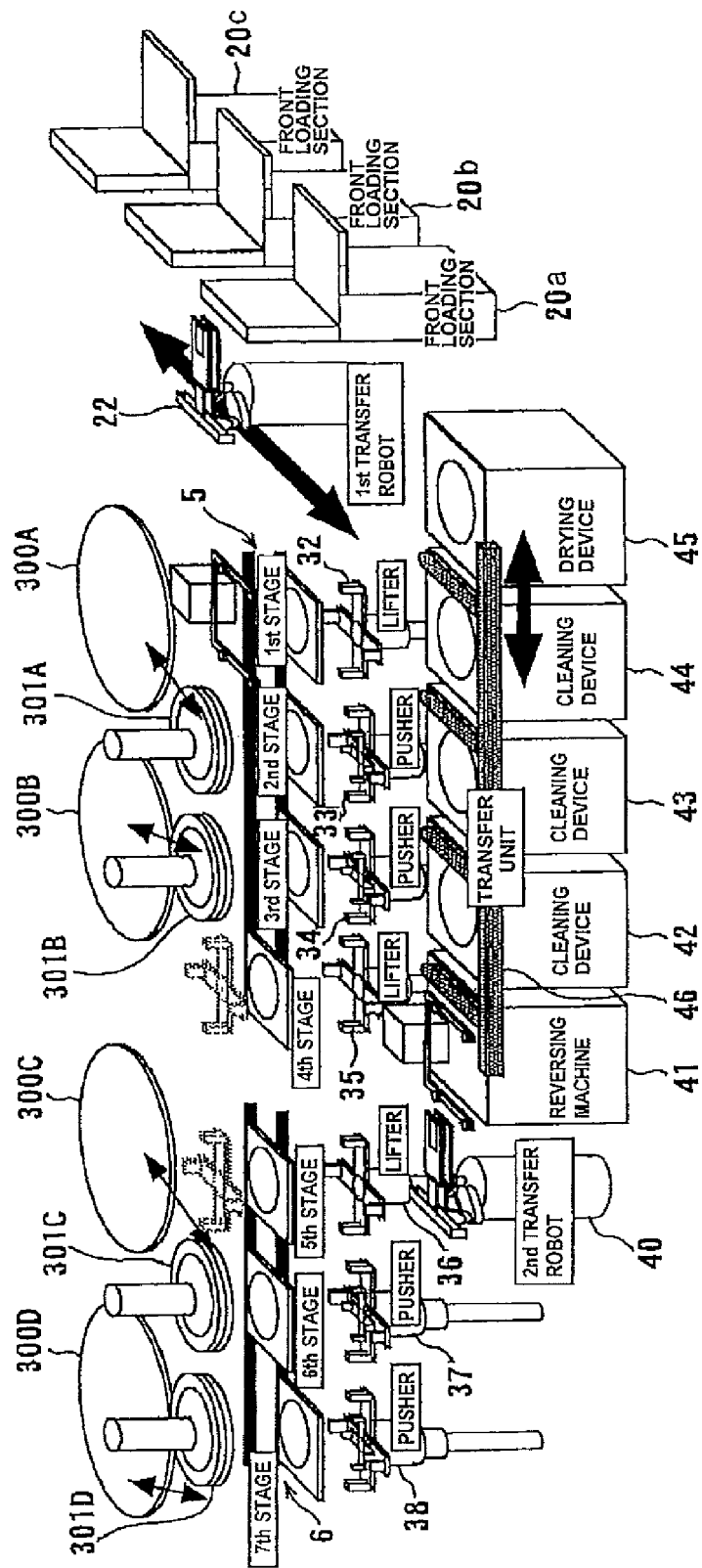
FIG. 2 is a schematic perspective view of the polishing apparatus shown in FIG. 1.

FIG. 1 is a plan view showing the overall construction of a polishing apparatus according to an embodiment of the present invention, and FIG. 2 is a schematic perspective view of the polishing apparatus shown in FIG. 1. As shown in FIG. 1, the polishing apparatus of this embodiment has a housing 1 in a substantially rectangular form. An interior space of the housing 1 is divided into a loading/unloading section 2, a polishing section 3 (3a, 3b), and a cleaning/drying section 4 by partition walls 1a, 1b, 1c. Further, a control section 8 is provided in this space. The loading/unloading section 2, the polishing sections 3a, 3b, and the cleaning/drying section 4 are assembled independently of each other, and air is discharged from these sections independently of each other.

The loading/unloading section 2 has two or more front loading sections, e.g., three front loading sections 20a, 20b, 20c in this embodiment, on which cassettes, each storing a number of wafers (substrates), are placed. The front loading sections 20a, 20b, 20c are arranged adjacent to each other along a width direction of the polishing apparatus (a direction perpendicular to a longitudinal direction of the polishing apparatus). Each of the front loading sections 20a, 20b, 20c can receive thereon an open cassette, an SMIF (Standard Manufacturing Interface) pod, or a FOUP (Front Opening Unified Pod). The SMIF and FOUP are a hermetically sealed container which houses a cassette therein and is covered with a partition wall to provide an interior environment isolated from an external space.

The loading/unloading section 2 has a moving mechanism 21 extending along an arrangement direction of the front loading sections 20a, 20b, 20c. A first transfer robot 22 as a first transfer device is installed on the moving mechanism 21 and is movable along the arrangement direction of the cassettes. An ITM (In-line Thickness Monitor) 23 as a film thickness measurement device for measuring a thickness of a polishing film before and after polishing of the wafer is provided on an extension of the moving mechanism 21. The first transfer robot 22 is operable to move on the moving mechanism 21 so as to access the wafers in the cassettes mounted in the front loading sections 20a, 20b, 20c and the ITM 23. The first transfer robot 22 takes wafers before polishing or after polishing out of the cassettes mounted in the front loading sections 20a, 20b, 20c. The ITM 23 receives a wafer from the first transfer robot 22, and then (In-line) measures a thickness of a polishing film, such as a copper film or a barrier film, formed on a surface of the wafer, based on an optical signal that is applied to and reflected on the wafer surface using an optical means, for example.

The loading/unloading section 2 is required to be the cleanest area. Therefore, pressure in the interior of the loading/unloading section 2 is kept higher at all times than pressures in the exterior space of the apparatus, the polishing section 3 and the cleaning/drying section 4. Further, a filter fan unit (not shown in the drawings) having a clean air filter, such as HEPA filter or ULPA filter, is provided above the moving mechanism 21 of the first transfer robot 22. This filter fan unit removes particles, toxic vapor, and toxic gas from air to produce clean air, and forms a downward flow of the clean air at all times.

The polishing section 3 is an area where a wafer is polished. The polishing section 3 includes a first polishing section 3a having a first polishing unit 30A and a second polishing unit 30B therein, and a second polishing section 3b having a third polishing unit 30C and a fourth polishing unit 30D therein. The first polishing unit 30A, the second polishing unit 30B, the third polishing unit 30C, and the fourth polishing unit 30D are arranged along the longitudinal direction of the polishing apparatus.

The first polishing unit 30A includes a polishing table 300A having a polishing surface 305A, a holder (top ring) 301A for holding a wafer and pressing the wafer against the polishing surface 305A so as to polish the wafer, a slurry supply nozzle 302A for supplying a slurry or a dressing liquid (e.g., pure water) onto the polishing surface 305A, a dresser 303A for dressing the polishing surface 305A, and an atomizer 304A having one or more nozzles for ejecting a mixture of a liquid (e.g., pure water) and a gas (e.g., nitrogen) in an atomized state to the polishing surface 305A. Similarly, the second polishing unit 30B includes a polishing table 300B having a polishing surface 305B, a holder 301B, a slurry supply nozzle 302B, a dresser 303B, and an atomizer 304B. The third polishing unit 30C includes a polishing table 300C having a polishing surface 305C, a holder 301C, a slurry supply nozzle 302C, a dresser 303C, and an atomizer 304C. The fourth polishing unit 30D includes a polishing table 300D having a polishing surface 305D, a holder 301D, a slurry supply nozzle 302D, a dresser 303D, and an atomizer 304D.

A first linear transporter 5 as a first (linear) transfer mechanism is provided between the first polishing unit 30A and the second polishing unit 30B in the first polishing section 3a and the cleaning/drying section 4. This first linear transporter 5 is configured to transfer a wafer between four transferring positions located along the longitudinal direction of the polishing apparatus (hereinafter, these four transferring positions will be referred to as a first transferring position TP1, a second transferring position TP2, a third transferring position TP3, and a fourth transferring position TP4 in the order from the loading/unloading section 2). A reversing machine 31 for reversing a wafer transferred from the first transfer robot 22 in the loading/unloading section 2 is disposed above the first transferring position TP1 of the first linear transporter 5. A vertically movable lifter 32 is disposed below the first transferring position TP1. A vertically movable pusher 33 is disposed below the second transferring position TP2, a vertically movable pusher 34 is disposed below the third transferring position TP3, and a vertically movable pusher 35 is disposed below the fourth transferring position TP4, respectively.

In the second polishing section 3b, a second linear transporter 6 as a second (linear) transfer mechanism is provided next to the first linear transporter 5. This second linear transporter 6 is configured to transfer a wafer between three transferring positions located along the longitudinal direction of the polishing apparatus (hereinafter, these three transferring positions will be referred to as a fifth transferring position TP5, a sixth transferring position TP6, and a seventh transferring position TP7 in the order from the loading/unloading section 2). A vertically movable lifter 36 is disposed below the fifth transferring position TP5 of the second linear transporter 6, a pusher 37 is disposed below the sixth transferring position TP6, and a pusher 38 is disposed below the seventh transferring position TP7, respectively.

As can be understood from the fact that a slurry is used during polishing, the polishing section 3 is the dirtiest area. Therefore, in order to prevent particles from spreading out of the polishing section 3, a gas is discharged from surrounding spaces of the respective polishing tables in this embodiment. In addition, pressure in the interior of the polishing section 3 is set to be lower than pressure in the exterior of the apparatus, the cleaning/drying section 4, and the loading/unloading section 2, whereby scattering of particles is prevented. Typically, discharge ducts (not shown in the drawings) are provided below the polishing tables, respectively, and filters (not shown in the drawings) are provided above the polishing tables, so that downward flows of clean air are formed from the filters to the discharge ducts.

The cleaning/drying section 4 is an area where a polished wafer is cleaned and dried. The cleaning/drying section 4 includes a second transfer robot 40, a reversing machine 41 for reversing a wafer transferred from the second transfer robot 40, three cleaning devices 42, 43, 44 for cleaning a polished wafer, a drying device 45 for spin-drying a cleaned wafer, and a transfer unit 46 as a third transfer mechanism for transferring a wafer between the reversing machine 41, the cleaning devices 42, 43, 44 and the drying device 45. The second transfer robot 40, the reversing machine 41, the cleaning devices 42, 43, 44 and the drying device 45 are arranged in series along the longitudinal direction of the polishing apparatus. A filter fan unit (not shown in the drawings), having a clean air filter, is provided above the cleaning devices 42, 43, 44 and the drying device 45. This filter fan unit is configured to remove particles from an air to produce a clean air, and to form downward flow of the clean air at all times. Pressure in the interior of the cleaning/drying section 4 is kept higher than pressure in the polishing section 3, so that particles in the polishing section 3 is prevented from flowing into the cleaning/drying section 4.

The polishing table 300A of the first polishing unit 30A has a polishing cloth or a grinding stone attached thereon, and the polishing pad or the grinding stone forms a polishing surface 305A to polish a wafer. At the time of polishing, a slurry is supplied onto the polishing surface 305A on the polishing table 300A from the slurry supply nozzle 302A while a wafer is being pressed against the polishing surface 305A to perform polishing. Further, the first polishing unit 30A has the atomizer 304A as a non-contact type dresser using a fluid pressure in addition to the mechanical dresser 303A. The atomizer 304A mainly serves to wash away polishing wastes and slurry particles which have been accumulated on or clogged in the polishing surface 305A. A combination of the cleaning of the polishing surface 305A by the atomizer 304A using a fluid pressure and the dressing of the polishing surface 305A by the dresser 303A using a mechanical contact can achieve more effective dressing, i.e., can regenerate the polishing surface 305A more effectively. The conditioning of the polishing surface by an atomizer is usually performed after dressing by a contact type dresser (e.g., diamond dresser). Each of the other polishing units 30B, 30C, 30D has the same structure.

As shown in FIG. 2, the first linear transporter 5 in the first polishing section 3a has four transfer stages: a first stage, a second stage, a third stage, and a fourth stage, which are linearly movable in a reciprocating manner. These stages have a two-line structure including an upper line and a lower line. Specifically, the first stage, the second stage and the third stage are disposed on the lower line, and the fourth stage is disposed on the upper line.

The lower first, second and third stages and the upper fourth stage can freely move without interfering with each other, because they are provided at different heights. The first stage transfers a wafer between the first transferring position TP1, at which the reversing machine 31 and the lifter 32 are disposed, and the second transferring position TP2, which is a wafer receiving/delivering position at which the pusher 33 is disposed. The second stage transfers a wafer between the second transferring position TP2 and the third transferring position TP3, which is a wafer receiving/delivering position at which the pusher 34 is disposed. The third stage transfers a wafer between the third transferring position TP3 and the fourth transferring position TP4 at which the pusher 35 is disposed. The fourth stage transfers wafer between the first transferring position TP1 and the fourth transferring position TP4.

The first linear transporter 5 is provided with an air cylinder (not shown in the drawings) for linearly reciprocating the upper-level fourth stage. The fourth stage is controlled such that it is moved by the air cylinder simultaneously with the lower-level first, second and third stages.

The second linear transporter 6 in the second polishing section 3b has three transfer stages: a fifth stage, a sixth stage and a seventh stage, which are linearly movable in a reciprocating manner. These stages have a two-line structure including an upper line and a lower line. Specifically, the fifth stage and the sixth stage are disposed on an upper line, whereas the seventh stage is disposed on a lower line.

The upper fifth and sixth stages and the lower seventh stage can freely move without interfering with each other, because they are provided at different heights. The fifth stage transfers a wafer between the fifth transferring position TP5, at which the lifter 36 is disposed, and the sixth transferring position TP6, which is a wafer receiving/delivering position at which the pusher 37 is disposed. The sixth stage transfers a wafer between the sixth transferring position TP6 and the seventh transferring position TP7, which is a wafer receiving/delivering position at which the pusher 38 is disposed. The seventh stage transfers a wafer between the fifth transferring position TP5 and the seventh transferring position TP7.

The reversing machine 31 in the first polishing section 3a is disposed at a position to which a hand of the first transfer robot 22 in the loading/unloading section 2 is accessible and serves to receive a wafer that has not been polished from the first transfer robot 22, reverse the wafer upside down, and deliver the wafer to the lifter 32. The reversing machine 41 in the cleaning/drying section 4 is disposed at a position to which a hand of the second transfer robot 40 is reachable and serves to receive a wafer after polishing from the second transfer robot 40, reverse the wafer upside down, and transfer the wafer to the transfer unit 46.

As shown in FIG. 1, a shutter 10 is provided between the reversing machine 31 and the first transfer robot 22. When transferring a wafer, the shutter 10 is opened, and the wafer is delivered between the first transfer robot 22 and the reversing machine 31. Shutters 11, 12, 13, and 14 are disposed between the reversing machine 41 and the second transfer robot 40, between the reversing machine 41 and the primary cleaning device 42, between the first polishing section 3a and the second transfer robot 40, and between the second polishing section 3b and the second transfer robot 40, respectively. For transferring wafers, the shutters 11, 12, 13, and 14 are opened, and a wafer is delivered between the reversing machine 41 and the second transfer robot 40 or the primary cleaning device 42. When a wafer is not transferred, the shutters 10, 11, 12, 13, and 14 are closed.

The lifter 32 in the first polishing section 3a is disposed at a position to which the first transfer robot 22 and the first linear transporter 5 are accessible, and serves as a first receiving/delivering mechanism for receiving and delivering a wafer between the first transfer robot 22 and the first linear transporter 5. Specifically, the lifter 32 serves to deliver a wafer reversed by the reversing machine 31 to the first stage or the fourth stage in the first linear transporter 5. The lifter 35 in the first polishing section 3a and the lifter 36 in the second polishing section 3b are disposed at positions to which the linear transporters 5, 6 and the second transfer robot 40 in the cleaning section 4 are accessible, and serves as a second receiving/delivering mechanism for receiving and delivering a wafer between the linear transporters 5, 6 and the second transfer robot 40. Specifically, the lifter 35 serves to deliver a wafer placed on the third stage or the fourth stage in the first linear transporter 5 to the second transfer robot 40, and the lifter 36 serves to deliver a wafer placed on the fifth stage or the seventh stage in the second linear transporter 6 to the second transfer robot 40.

The pusher 33 in the first polishing section 3*a* serves to receive a wafer from the first stage in the first linear transporter 5 and deliver the wafer to the holder 301A of the first polishing unit 30A, and also serves to receive a polished wafer from the first polishing unit 30A and deliver the wafer to the second stage in the first linear transporter 5. The pusher 34 serves to receive a wafer from the second stage in the first linear transporter 5 and deliver the wafer to the holder 301B of the second polishing unit 30B, and also serves to receive a polished wafer from the second polishing unit 30B and deliver the wafer to the third stage in the first linear transporter 5. The pusher 37 in the second polishing section 3*b* serves to receive a wafer from the fifth stage in the second linear transporter 6 and deliver the wafer to the holder 301C of the third polishing unit 30C, and also serves to receive a polished wafer from the third polishing unit 30C and deliver the wafer to the sixth stage in the second linear transporter 6. The pusher 38 serves to receive a wafer from the sixth stage in the second linear transporter 6 and deliver the wafer to the holder 301D of the fourth polishing unit 30D, and also serves to receive a polished wafer from the fourth polishing unit 30D and deliver the wafer to the seventh stage in the second linear transporter 6. Thus, the pushers 33, 34, 37 and 38 serve as a third receiving/delivering mechanism for receiving and delivering wafers between the linear transporters 5, 6 and the respective holders.

The primary cleaning device 42 and the secondary cleaning device 43 in the cleaning/drying section 4 may comprise, for example, a roll type cleaning device which rotates and presses upper and lower roll-shaped sponges against front and rear surfaces of a wafer to clean the front and rear surfaces of the wafer. The tertiary cleaning device 44 may comprise, for example, a pencil type cleaning device which rotates and presses a hemispherical sponge against a wafer to clean the wafer. The drying device 45 has a wafer stage for rotating a chucked wafer at a high speed, and thus has the function (spin-drying function) of drying a wafer after cleaning by rotating it at a high speed. It is possible to additionally provide in any of the cleaning devices 42, 43, 44 a megasonic-type cleaning device, which carries out cleaning by applying ultrasonic waves to a cleaning liquid, in addition to the above-described roll-type cleaning device or pencil-type cleaning device.

The transfer unit 46 has four chucking units (not shown in the drawings) as a holding mechanism for detachably holding wafers, so that wafers can be transferred simultaneously from the reversing machine 41 to the primary cleaning device 42, from the primary cleaning device 42 to the secondary cleaning device 43, from the secondary cleaning device 43 to the tertiary cleaning device 44, and from the tertiary cleaning device 44 to the drying device 45. Thus, because the wafers are moved within the cleaning/drying section 4 to the next devices without taking wafers out to the outside of the cleaning/drying section 4, a stroke required for transferring the wafers can be minimized, and a wafer transferring time can be shortened.

Next, operation (except film thickness measurement of a polishing film on a wafer surface) of the polishing apparatus thus constructed for polishing wafers will be described below.

This polishing apparatus mainly performs parallel processing of wafers. When parallel processing of a wafer is performed, the wafer is transferred on the following route: the cassette of the front loading section 20*a*, 20*b* or 20*c*→the first transfer robot 22→the reversing machine 31→the lifter 32→the first stage of the first linear transporter 5→the pusher 33→the holder 301A→the polishing table 300A→the pusher 33→the second stage of the first linear transporter 5→the pusher 34→the holder 301B→the polishing table 300B→the pusher 34→the third stage of the first linear transporter 5→the lifter 35→the second transfer robot 40→the reversing machine 41→the primary cleaning device 42→the secondary cleaning device 43→the tertiary cleaning device 44→the spin-drying device→the first transfer robot 22→the wafer cassette of the front loading section 20*a*, 20*b* or 20*c*.

Another wafer is transferred on the following route: the wafer cassette of the front loading section 20*a*, 20*b* or 20*c*→the first transfer robot 22→the reversing machine 31→the lifter 32→the fourth stage of the first linear transporter 5→the lifter 35→the second transfer robot 40→the lifter 36→the fifth stage of the second linear transporter 6→the pusher 37→the holder 301C→the polishing table 300C→the pusher 37→the sixth stage of the second linear transporter 6→the pusher 38→the holder 301D→the polishing table 300D→the pusher 38→the seventh stage of the second linear transporter 6→the lifter 36→the second transfer robot 40→the reversing machine 41→the primary cleaning device 42→the secondary cleaning device 43→the tertiary cleaning device 44→the drying device 45→the first transfer robot 22→the wafer cassette of the front loading section 20*a*, 20*b* or 20*c*.

Next, the operation of the polishing apparatus at the start of polishing will now be described taking as an example a case where a cassette, in which dummy wafers are housed, is mounted in the front loading section 20*a* of the three front loading sections 20*a*, 20*b*, 20*c* and a cassette, in which product wafers are housed, is mounted in each of the other front loading sections 20*b*, 20*c*. The "dummy wafer" herein refers to a wafer in which no interconnect pattern is formed and which is to be used, for example, to monitor the situation of polishing or to maintain operating conditions in polishing. On the other hand, the "product wafer" refers to a wafer as a product, having an interconnect pattern.

Figure 3:
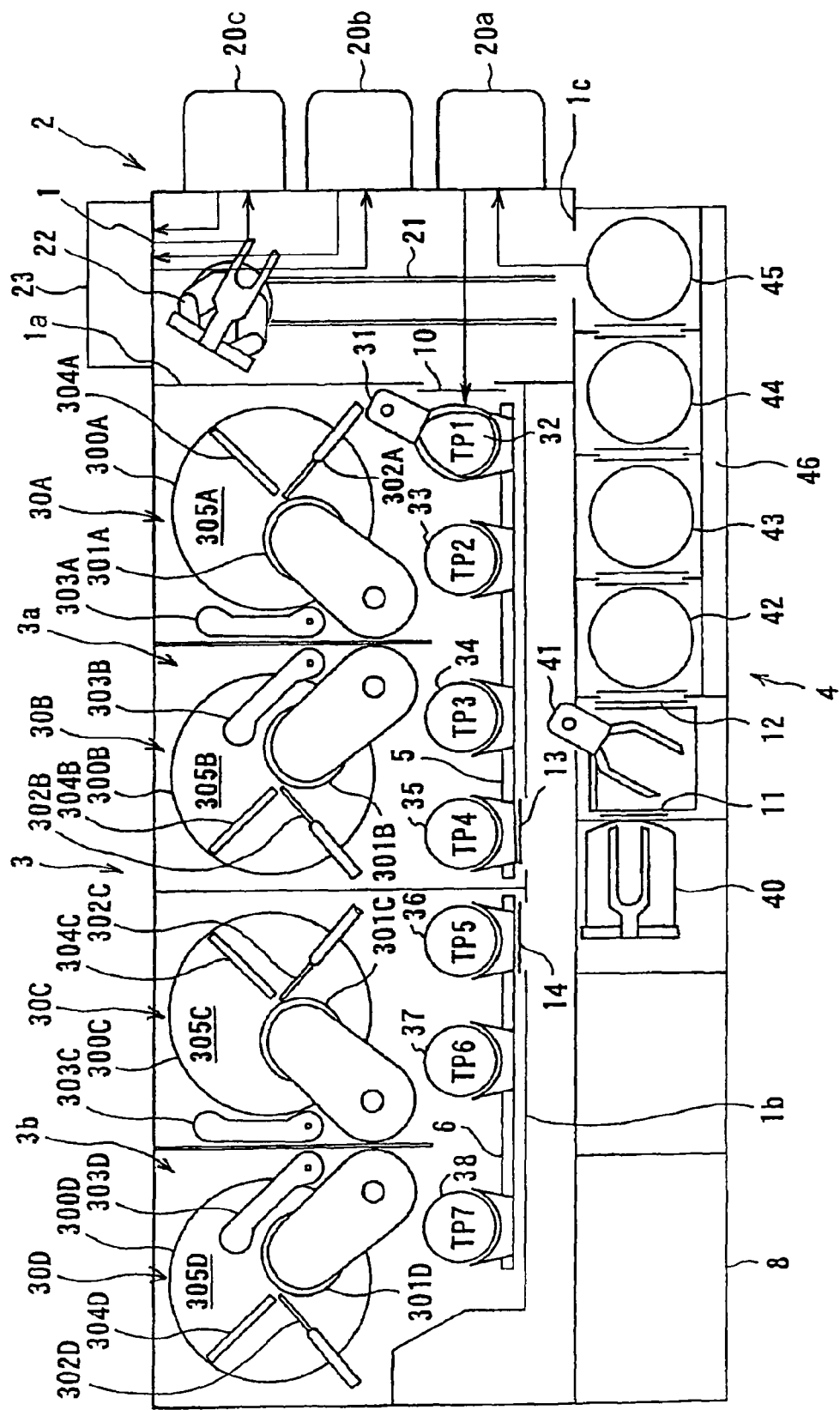
FIG. 3 is a plan view showing the overall construction of the polishing apparatus, illustrating the flow of wafers in the operation of measuring a thickness of a polishing film of a respective product wafer, which has been taken out of a cassette, with an ITM while polishing a dummy wafer, which has been taken out of a cassette, in a polishing section.

At the start of polishing in the polishing apparatus, it is necessary to first polish dummy wafers in the polishing units 30A, 30B, 30C, 30D in order to adjust the polishing surfaces 305A, 305B, 305C, 305D of the polishing units 30A, 30B, 30C, 30D into good conditions for polishing. To do this, as shown in FIG. 3, dummy wafers are taken out one by one by the first transfer robot 22 from the cassette mounted in the front loading section 20*a*, sequentially transferred to the reversing machine 31 in the first polishing section 3*a*, and polished with the polishing surfaces 305A, 305B, 305C, 305D of the polishing units 30A, 30B, 30C, 30D. The dummy wafers after polishing are cleaned in the cleaning devices 42, 43, 44, dried in the drying device 45, and then returned to the cassette mounted in the front loading section 20*a*.

Meanwhile, with respect to the product wafers housed in the cassettes mounted in the front loading sections 20*b*, 20*c*, one product wafer is taken out of each of the cassettes by the first transfer robot 22, and the wafer is transferred to the ITM (film thickness measurement device) 23 and a thickness of a polishing film is measured with the ITM 23. After the film thickness measurement, the product wafer is returned to the original cassette. This operation is repeated sequentially to carry out the film thickness measurement for the product wafers which have been taken out of the cassettes mounted in the front loading sections 20*b*, 20*c*. The film thickness measurement with the ITM 23 is carried out in a sequential operation. That is, the film thickness measurement step is carried out separately from the polishing step and the cleaning/drying step.

In conventional practice, the film thickness measurement for pre-polishing product wafers is carried out in a sequence of product wafer polishing steps (pre-polishing film thickness measurement step→polishing step→cleaning/drying step→post-polishing film thickness measurement step) after the completion of polishing of dummy wafers. In this embodiment, as shown in FIG. 3, the film thickness measurement for pre-polishing product wafers is carried out in parallel with the polishing step and the cleaning/drying step for dummy wafers, that is, in advance of the polishing step for the product wafers and separately from the other steps for the product wafers. This apparently shortens the film thickness measurement tact time. In this regard, the film thickness measurement tact time in a product wafer polishing process consists of pre-polishing measurement tact time and post-polishing measurement tact time. Thus, the film thickness measurement tact time can be shortened as a whole by moving forward the pre-polishing film thickness measurement.

Figure 4:
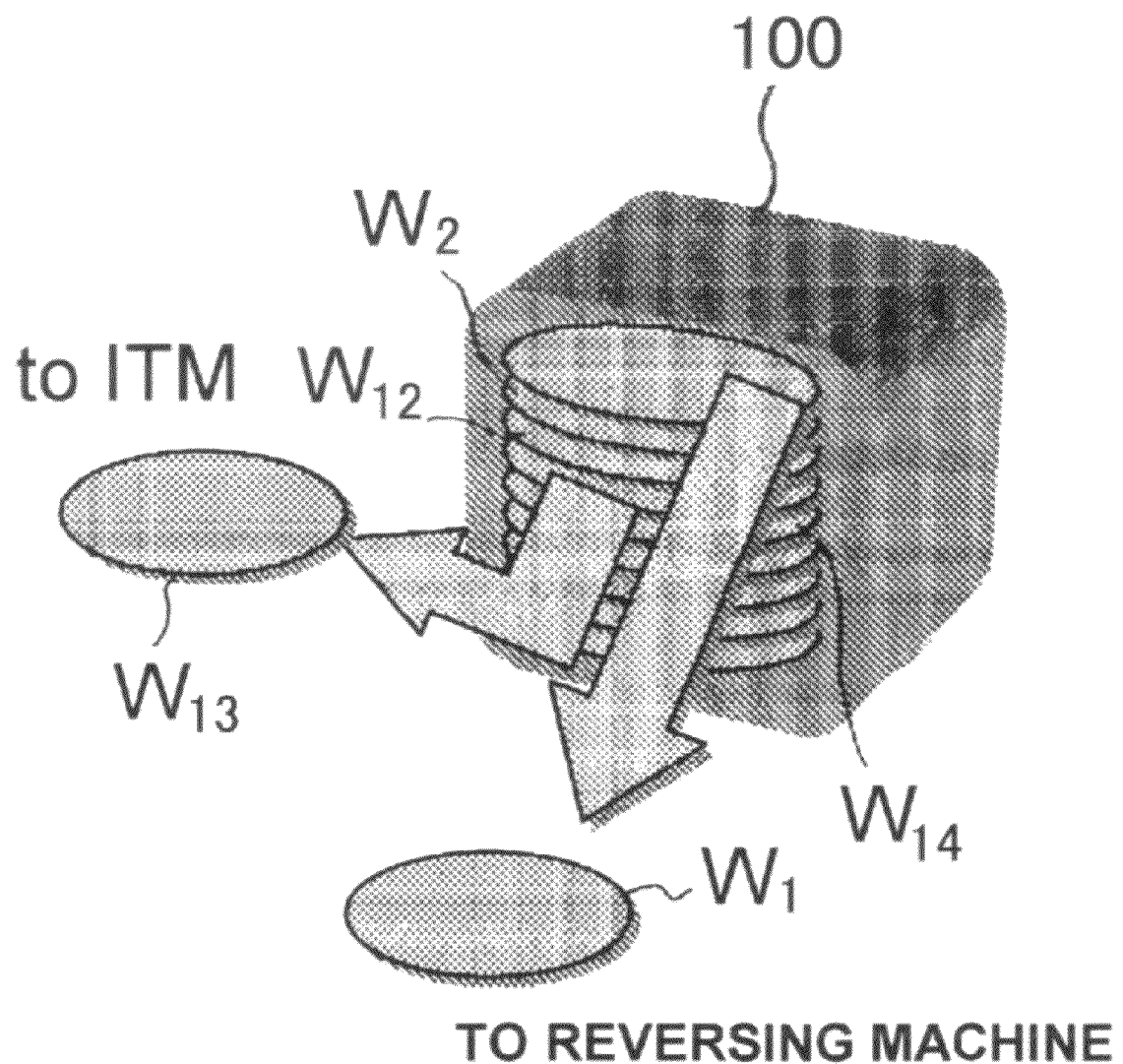
FIG. 4 is a diagram illustrating an example of the state of wafers housed in a cassette.

A description will now be made of the operation of the polishing apparatus in a case where measurement of a thickness of a polishing film is carried out only before polishing for the 1st wafer $W_1$ of 25 wafers W housed in a cassette 100, as shown in FIG. 4, the film thickness measurement is not carried out for the 2nd to 12th wafers $W_2$-$W_{12}$, the film thickness measurement is carried out before and after polishing for the 13th wafer $W_{13}$, and the film thickness measurement is not carried out for the 14th wafer $W_{14}$ and the subsequent wafers. The cassette 100 is mounted in one of the front loading sections 20a, 20b, 20c, and the wafers are all product wafers.

There is a case where depending on the stability of polishing environment, user demand, etc., measurement of a thickness of a polishing film is carried out, according to the polishing recipe, not for all the product wafers but only for arbitrarily selected wafers.

In this embodiment, the first wafer $W_1$ is taken out of the cassette 100 by the first transfer robot 22 and transferred to the ITM 23 to measure a thickness of a polishing film. The wafer $W_1$ after the film thickness measurement is returned from the ITM 23 to the cassette 100 by the first transfer robot 22. Later, the first wafer $W_1$ after the film thickness measurement is taken out of the cassette 100 by the first transfer robot 22, transferred to the reversing machine 32, and the sequence of polishing and cleaning/drying steps is carried out for the wafer $W_1$. During the polishing and cleaning/drying after polishing of the wafer $W_1$, the 13th wafer $W_{13}$ is taken out of the cassette 100 by the first transfer robot 22 and transferred to the ITM 23 to measure a thickness of a polishing film. The wafer $W_{13}$ after the film thickness measurement is returned from the ITM 23 to the cassette 100.

The second wafer $W_2$ and the subsequent wafers are sequentially taken out of the cassette 100 by the first transfer robot 22, transferred to the reversing machine 31, and polishing and cleaning/drying after polishing of the wafers are sequentially carried out. The wafers after cleaning/drying are returned to the cassette 100 by the first transfer robot 22. With respect to the 13th wafer $W_{13}$ which has been returned to the cassette 100 after the polishing and cleaning/drying steps, the wafer $W_{13}$ is taken out of the cassette 100 by the first transfer robot 22 and transferred to the ITM 23 to measure the thickness of the polishing film, as described above. The wafer $W_{13}$ after the film thickness measurement is returned from the ITM 23 to the cassette 100 by the first transfer robot 22.

In conventional practice, wafers are subjected to a polishing process substantially in numerical order. Thus, the pre-polishing film measurement for the 13th wafer is carried out after the 12th wafer is transferred to the polishing section. However, according to this embodiment of the present invention, the film thickness measurement step can be moved forward separately from the other steps to avoid delay in other steps.

Figure 5:
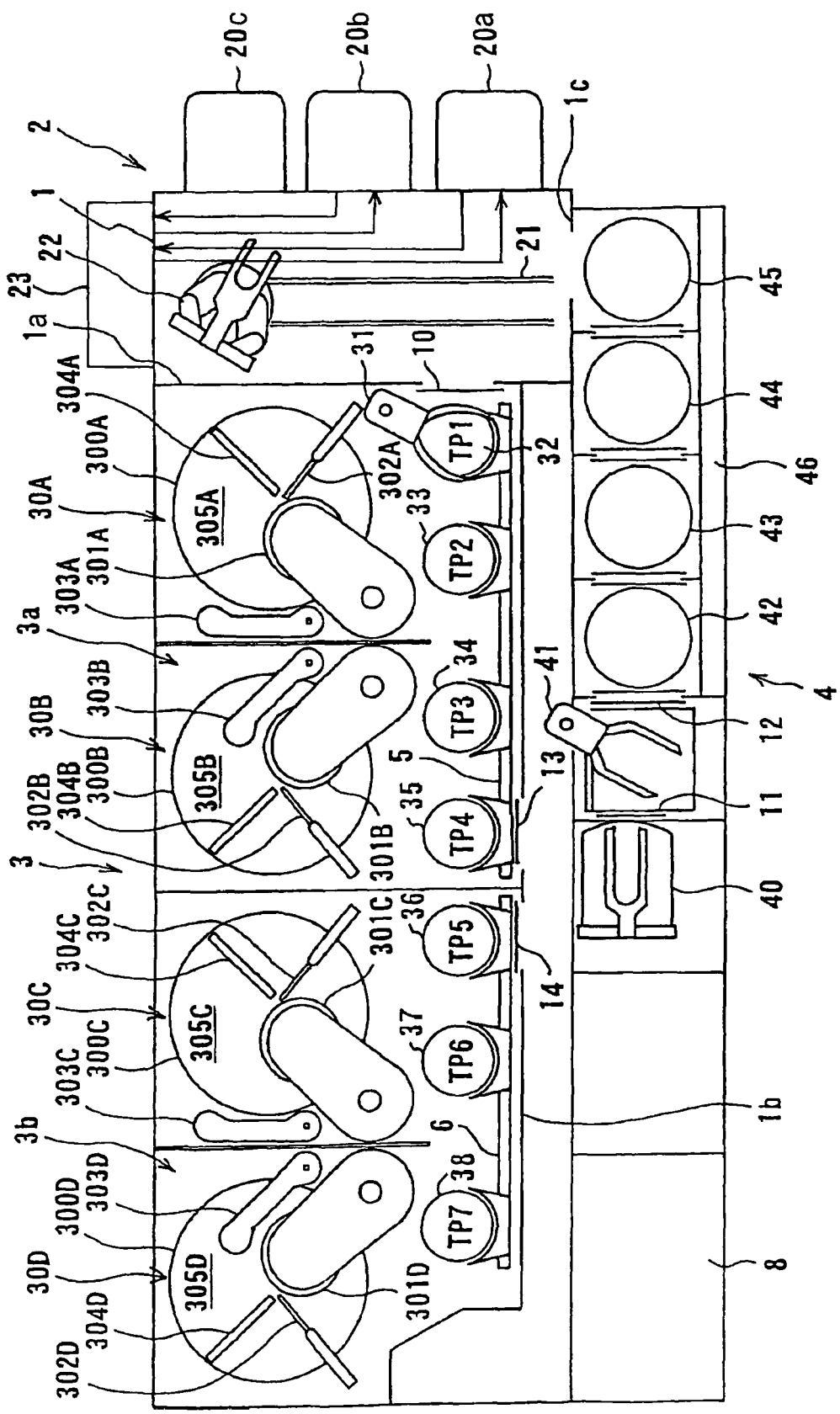
FIG. 5 is a plan view showing the overall construction of the polishing apparatus, illustrating the flow of wafers in the operation of measuring a thickness of a polishing film of a respective product wafer, which has been taken out of a cassette, with an ITM and returning the wafer to the cassette.

FIG. 5 shows a wafer transfer route along which a wafer (product wafer), taken out of a cassette mounted in the front loading section 20a, 20b, is transferred to the ITM 23 for measurement of a thickness of a polishing film, and the wafer after the measurement is returned to the cassette. In particular, a wafer, for which measurement of a thickness of a polishing film is necessary, is taken by the first transfer robot 22 out of the cassette mounted in the front loading section 20a or 20b and transferred to the ITM 23. After measuring a thickness of a polishing film with the ITM 23, the wafer is taken out of the ITM 23 by the first transfer robot 22 and returned to the cassette mounted in the front loading section 20a or 20b. The first transfer robot 22 takes out of the cassette the next wafer for which measurement of a thickness of a polishing film is necessary, and repeats the above operation.

Figure 6:
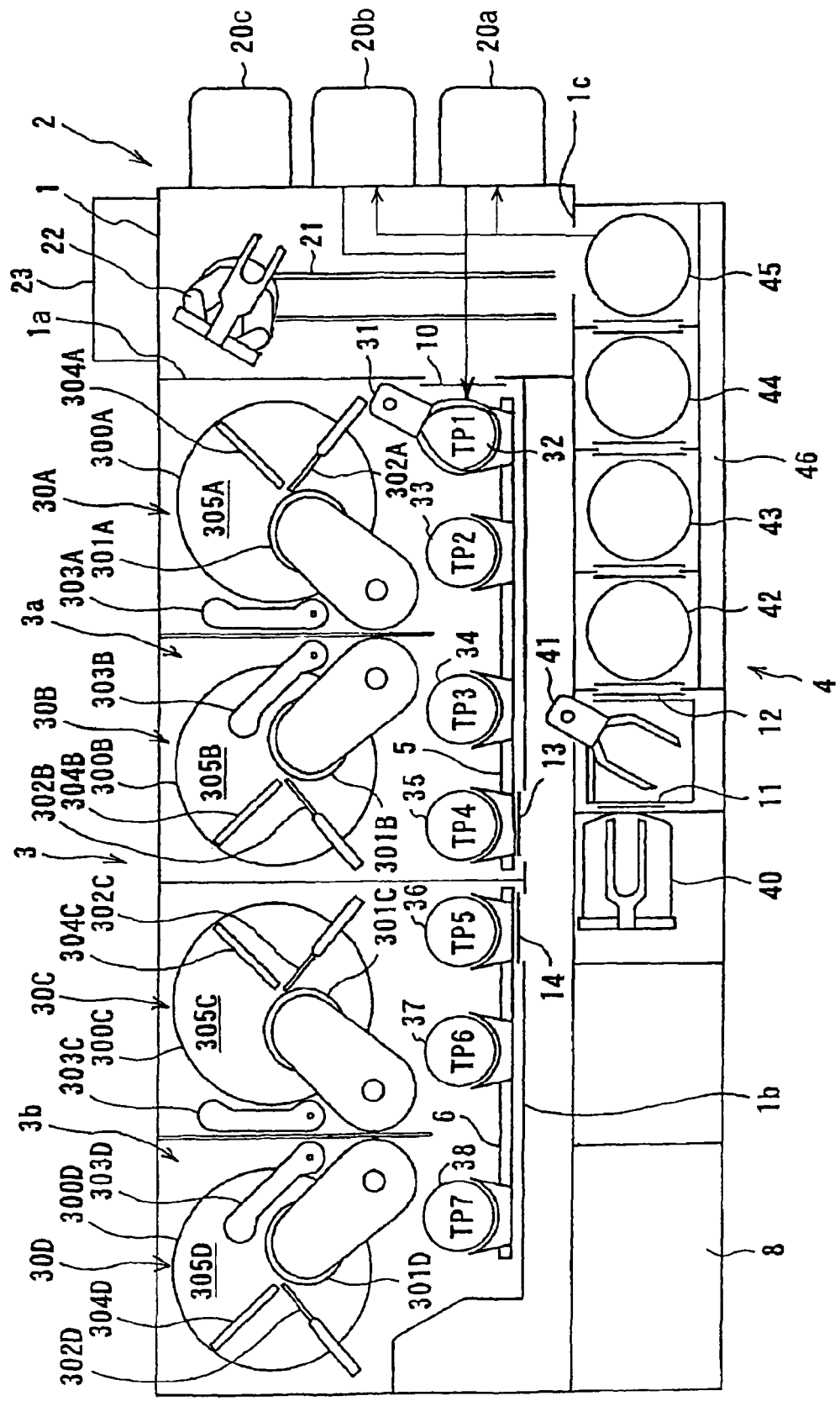
FIG. 6 is a plan view showing the overall construction of the polishing apparatus, illustrating the flow of wafers in the operation of polishing a respective wafer, which has been taken out of a cassette, in the polishing section and returning the wafer to the cassette.

FIG. 6 shows a wafer transfer route upon polishing of a wafer taken out of a cassette mounted in the front loading section 20a, 20b. In particular, wafers are taken one by one by the first transfer robot 22 out of the cassette mounted in the front loading section 20a or 20b and transferred to the reversing machine 32 in the first polishing section 3a. Each wafer transferred to the reversing machine 32 is then subjected to two-step polishing in one of the first polishing section 3a and the second polishing section 3b. After the polishing, the wafer is transferred to the cleaning/drying section 4. The wafer is cleaned in the cleaning devices 42, 43, 44 in the cleaning/drying section 4, and is then spin-dried in the drying device 45. The wafer after the spin-drying is taken out of the drying device 45 by the first transfer robot 22 and returned to the cassette mounted in the front loading section 20a or 20b.

In this manner, the first transfer robot 22 reciprocates between the cassette and the ITM 23 for the thickness measurement of a polishing film, and transfers a wafer from the cassette directly to the reversing machine 32 for polishing. By thus independently carrying out the transfer step for film thickness measurement separately from the other steps, corrosion of metal interconnects of a wafer after the polishing step and before the cleaning step can be avoided. In this connection, it is conventional practice to carry out the film thickness measurement step and the other steps successively or in sequence. Accordingly, a wafer must stand by on a drying device or on a cleaning device until an ITM (film thickness measurement device) becomes available. Consequently, a wafer after the polishing step must stand by until the cleaning device becomes available, which can cause corrosion of metal interconnects. By returning a wafer after drying to a cassette without waiting for vacancy in the ITM (film thickness measurement device) as described above, a wafer after polishing can be sent to the cleaning/drying step.

A description will now be made of parallel operations of 50 wafers, 25 each of which are housed in cassettes mounted in the front loading sections 20a, 20b. Film measurement conditions for the respective wafers are shown in Table 1 below.

TABLE 1

| Slot | Measurement Condition |
|---|---|
| 1 | Pre & Post |
| 2 | Pre & Post |
| 3 | Post |
| 4 | Non |
| 5 | Post |

TABLE 1-continued

Measurement Condition

| Slot | |
|---|---|
| 6 | Non |
| 7 | Pre & Post |
| 8 | Post |
| 9 | Non |
| 10 | Post |
| 11 | Non |
| 12 | Post |
| 13 | Pre & Post |
| 14 | Post |
| 15 | Non |
| 16 | Post |
| 17 | Non |
| 18 | Post |
| 19 | Pre & Post |
| 20 | Post |
| 21 | Non |
| 22 | Post |
| 23 | Non |
| 24 | Post |
| 25 | Pre & Post |
| Number of measurements | 23 |

In table 1, the expression "Pre & Post" represents a wafer for which measurement of a thickness of a polishing film is carried out before polishing and after polishing, the expression "Post" represents a wafer for which measurement of a thickness of a polishing film is carried out only after polishing, and the expression "Non" represents a wafer for which no measurement of a thickness of a polishing film is carried out neither before polishing nor after polishing. In this embodiment, the number of "Pre & Post" wafers is 6, the number of "Post" wafers is 11, and the number of "Non" wafers is 8. The ITM 23 therefore carries out the film thickness measurement 23 times in total (2×6+1×11).

The following six types of wafers are co-present in the cassettes mounted in the front loading sections 20a, 20b:

(1) Wafer before film thickness measurement and before polishing (pre-polishing, pre-film thickness measurement wafer);

(2) Wafer before polishing, for which pre-polishing film thickness measurement is not necessary (pre-polishing, non-film thickness measurement wafer);

(3) Wafer after film thickness measurement (or during film thickness measurement) and before polishing (post-film thickness measurement, pre-polishing wafer);

(4) Wafer after polishing and cleaning/drying, and before film thickness measurement (post-polishing, pre-film thickness measurement wafer);

(5) Wafer after polishing and cleaning/drying, and after film thickness measurement (process-finished wafer); and (6) Wafer after polishing and cleaning/drying, for which film thickness measurement is not necessary (process-finished wafer).

Figure 7:
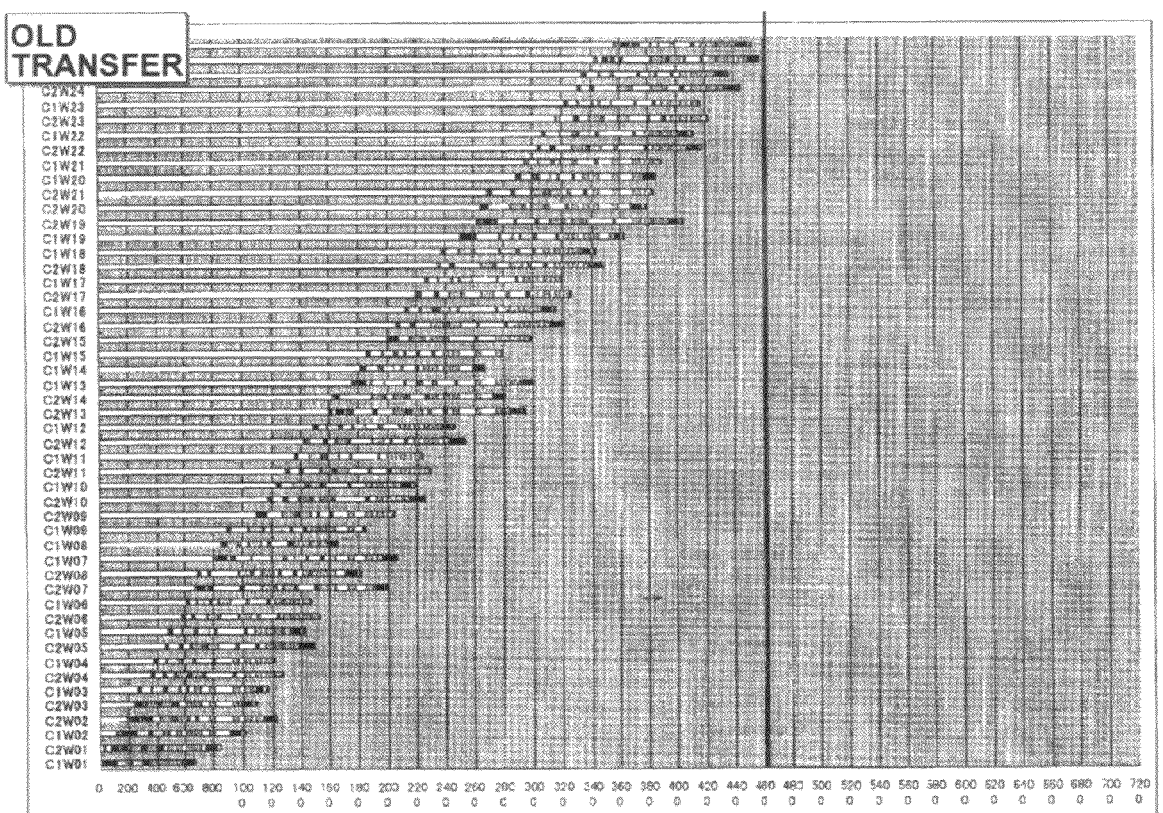
FIG. 7 is a diagram showing the relationship between operations for each of 50 wafers and the operating time of each operation in parallel operations of the 50 wafers as carried out in a conventional manner.

FIG. 7 shows the relationship between operations for each of the 50 wafers and the operating time of each operation in parallel operations of the 50 wafers as carried out substantially in numerical order in a conventional manner. Thus, the film thickness measurement step and the other steps are carried out successively regardless of the above-described wafer types.

In FIG. 7, the abscissa denotes time (e.g., second) and the ordinate denotes the product wafers as polishing objects. The lowermost symbol "C1W01" of the ordinate, for example, indicates a wafer placed on the first shelf of the cassette mounted in the front loading section 20a. The operations for each wafer are each boxed; the white section indicates waiting time, and the other sections indicate the transfer step, the polishing step, the cleaning/drying step, the film thickness measurement step, etc. As can be seen from FIG. 7, it takes 4600 seconds to complete the steps of pre-polishing film thickness measurement, polishing, cleaning/drying and post-polishing film thickness measurement for all the 50 wafers and return the wafers to the cassettes.

Figure 8:
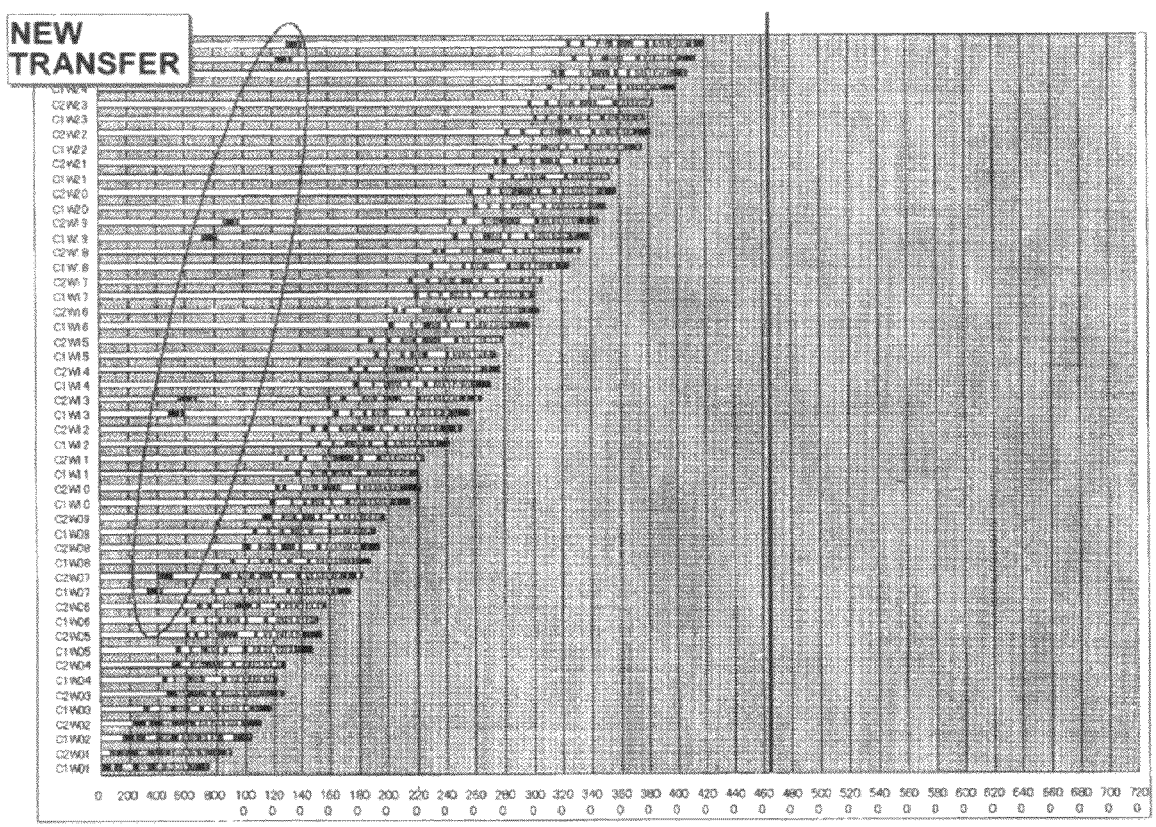
FIG. 8 is a diagram showing the relationship between operations for each of 50 wafers and the operating time of each operation in parallel operations of the 50 wafers as carried out according to an embodiment of the present invention.

According to the present invention, the control section 8 of the polishing apparatus manages each wafer based on which of the above-described 6 types the wafer belongs to and processes the respective wafers, as shown in FIG. 8.

In particular, the control section 8, based on the number of (3) post-film thickness measurement, pre-polishing wafers and the number of (4) post-polishing, pre-film thickness measurement wafers, determines which of a (1) pre-polishing, pre-film thickness measurement wafer and a (4) post-polishing, pre-film thickness measurement wafer is to be carried into the ITM 23. If a number of (3) post-film thickness measurement, pre-polishing wafers are in a cassette, stopping the film thickness measurement for a pre-polishing wafer will not interfere with the later polishing step. Therefore, the control section 8 gives preference to the film thickness measurement for a post-polishing, pre-film thickness measurement wafer over the film thickness measurement for a pre-polishing wafer.

In conventional practice, the film thickness measurement for a pre-polishing wafer and the film thickness measurement for a post-polishing wafer are generally carried out alternately. By separating the film thickness measurement step from the other steps according to this embodiment, it becomes possible to move forward the film thickness measurement for a pre-polishing wafer. This gives elbowroom to the film thickness measurement step for the pre-polishing wafer. By devoting the elbowroom to the film thickness measurement for a post-polishing wafer, it becomes possible to reduce the waiting time of a wafer after polishing, standing by for measurement of a thickness of a polishing film, thereby increasing the throughput of an entire polishing apparatus. Furthermore, the reduction in the measurement-waiting time for a polishing film of a post-polishing wafer enables earlier feedback.

Figure 9:
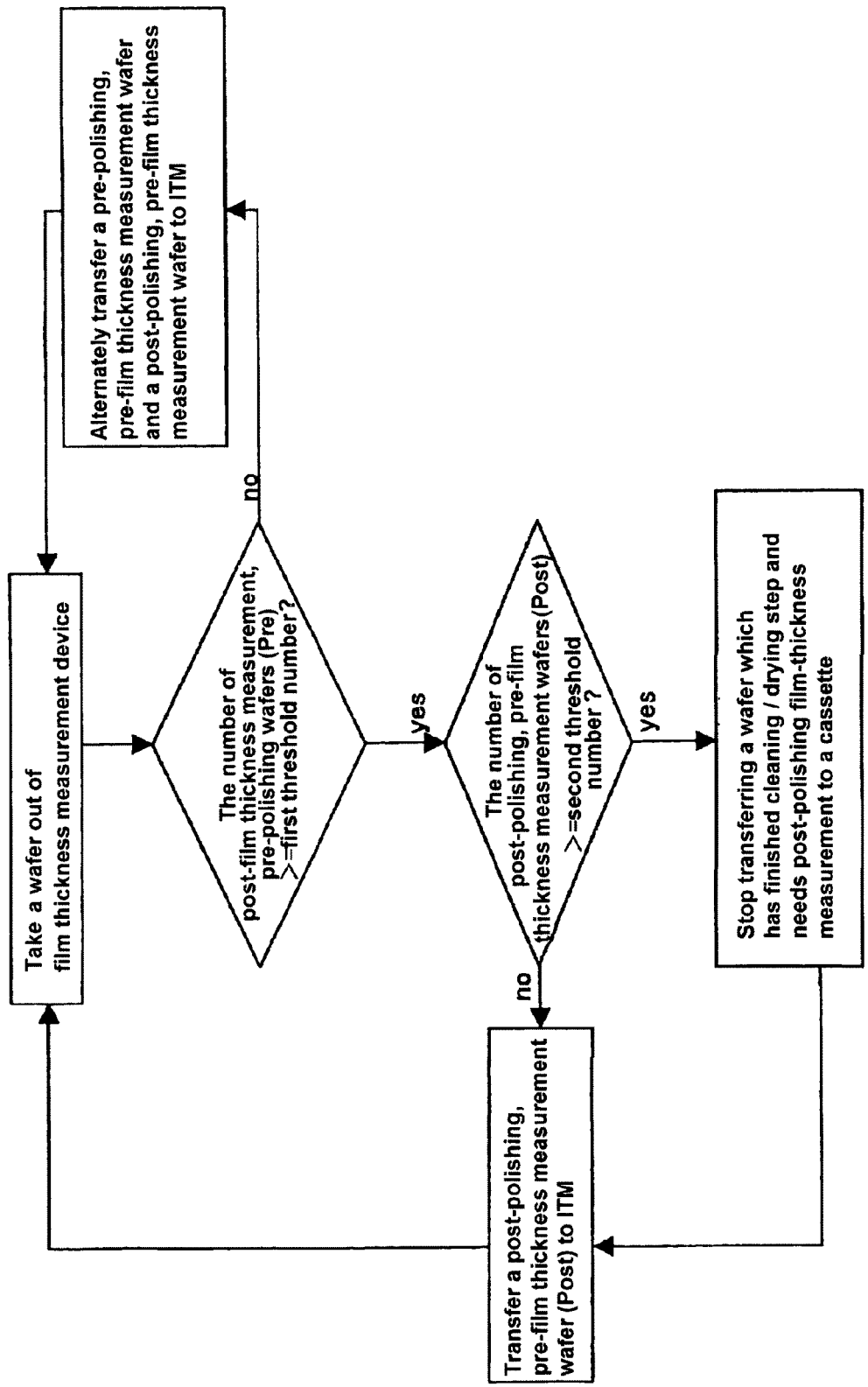
FIG. 9 is a flow chart in which a first threshold number and a second threshold number are used as criteria for judgment.

More specifically, as shown in FIG. 9, the control section 8 has a predetermined threshold number (first threshold number) with reference to the number of (3) post-film thickness measurement, pre-polishing wafers. The threshold number, which may be any arbitrary number, can be inputted by a worker, e.g., through an interface of the polishing apparatus. Assume that the threshold number (first threshold number) is 1. The ITM 23 carries out thickness measurement of a polishing film of a (1) pre-polishing product wafer during polishing of a dummy wafer or a product wafer for which the film thickness measurement is not necessary. For the product wafer which has undergone the film thickness measurement, 1 is counted in the control section 8 as a (3) post-film thickness measurement, pre-polishing wafer. The (3) post-film thickness measurement, pre-polishing wafer is returned to the cassette for a while.

In this case, elbowroom, corresponding to one wafer, is given to wafers which are to be subjected to pre-polishing film thickness measurement. The control section 8 therefore causes the polishing apparatus to preferentially carry a (4) post-polishing, pre-film thickness measurement wafer into the ITM 23 when the number of (3) post-film thickness measurement, pre-polishing wafers is more than the threshold number (first threshold number). This shortens the apparent tact time of the ITM 23.

When polishing in the polishing sections 3*a*, 3*b* of the dummy wafers or of the product wafers, for which the film thickness measurement is not necessary, is finished and transferred to the next cleaning/drying section 4 and, in parallel therewith, the (3) post-film thickness measurement, pre-polishing wafer is transferred to the polishing sections 3*a*, 3*b*, the count of (3) post-film thickness measurement, pre-polishing wafers becomes 0. The control section 8 then controls the ITM 23 and the first transfer robot 22 so that a thickness of a polishing film of a pre-polishing wafer and a thickness of a polishing film of a post-polishing wafer are measured alternately as in a conventional manner. Namely, the threshold number (first threshold number) of (3) post-film thickness measurement, pre-polishing wafers thus determines priority as to which of a (1) pre-polishing, pre-film thickness measurement wafer and a (4) post-polishing, pre-film thickness measurement wafer is to be carried into the ITM 23. When the number of (3) post-film thickness measurement, pre-polishing wafers is more than the threshold number, it indicates that the extra number of (3) post-film thickness measurement, pre-polishing wafers are in stock. On receipt of that information, the control section 8 gives the ITM 23 and the first transfer robot 22 a command to preferentially carry out the film thickness measurement for a (4) post-polishing, pre-film thickness measurement wafer(s).

Furthermore, the control section 8 checks the number of (3) post-film thickness measurement, pre-polishing wafers even during the film thickness measurement for a (4) post-polishing, pre-film thickness measurement wafer. When the number of post-film thickness measurement, pre-polishing wafers falls below the threshold number (first threshold number) 1, the control section 8 then controls the ITM 23 and the first transfer robot 22 so as to alternately measure a thickness of a polishing film of a pre-polishing wafer and a thickness of a polishing film of a post-polishing wafer in a conventional manner.

FIG. 8 shows the results of parallel operations of 50 wafers as carried out in the manner of independently carrying out pre-polishing measurement of a thickness of a polishing film (corresponding to "Pre" of the expression "Pre & Post" in Table 1) separately from the other polishing and cleaning/drying steps. The pre-polishing film thickness measurement step, carried out in advance of the other steps, is shown inside the oval line. As can be seen from the data in FIG. 8, it takes 4200 seconds to complete the polishing process for polishing all the wafers in the cassettes. Comparison with the data in FIG. 7 indicates about 10% increase in the throughput by the present invention.

While in this embodiment is used the limited number of wafers for which both pre-polishing film thickness measurement and post-polishing film thickness measurement are carried out, there is a case in which, depending on the process, a large number of wafers or even all the wafers must be subjected to the both measurements. In such a case, even if the pre-polishing film thickness measurement is carried out in advance, the resulting elbowroom can disappear early depending on the film measurement tact time, which may give rise to wafers waiting for vacancy in the ITM. This leads to delayed feedback of the results of the film thickness measurement, resulting in delayed response to a change in the polishing environment.

Consider the case where a plurality of (4) post-polishing, pre-film thickness measurement wafers are stored in a cassette, for example. Assume that the (4) post-polishing, pre-film thickness measurement wafers have been poorly polished due to a change in the polishing environment. Because the film thickness measurement step has not yet been carried out for the wafers and thus the data has not been fed back, defective wafers will be produced one after another.

In such a case, a threshold number (second threshold number) is set on the number of (4) post-polishing, pre-film thickness measurement wafers in the control section 8. As shown in FIG. 9, when the number of (4) post-polishing, pre-film thickness measurement wafers exceeds the threshold number, the control section 8 causes the polishing apparatus to stop transferring to the cassette a wafer which has finished the cleaning/drying step and needs post-polishing film thickness measurement, and to transfer a (4) post-polishing, pre-film thickness measurement wafer(s) to the ITM 23. As with the first threshold number for (3) post-film thickness measurement, pre-polishing wafers, the second threshold number may be any arbitrary number, and can be inputted by a worker, e.g., through an interface of the polishing apparatus.

In this case, since the wafer after cleaning/drying is not transferred to the cassette, there is no increase in the number of (4) post-polishing, pre-film thickness measurement wafers. In addition, since a (4) post-polishing, pre-film thickness measurement wafer(s) is transferred to the ITM 23, the situation "the number of (4) post-polishing, pre-film thickness measurement wafers is more than the second threshold number" will end after a period of time. With respect to wafers for which post-polishing film thickness measurement is not necessary, they are returned to the cassette after cleaning/drying. In summary, the above-described control is directed to matching the tact time of the entire polishing apparatus to the tact time of the ITM 23.

As described hereinabove, the threshold number (first threshold number) of post-film thickness measurement, pre-polishing wafers determines priority as to which of a (1) pre-polishing, pre-film thickness measurement wafer and a (4) post-polishing, pre-film thickness measurement wafer is to be carried into the ITM 23. On the other hand, the threshold number (second threshold number) of post-polishing, pre-film thickness measurement wafers determines whether or not to stop sending new wafers to the polishing section.

By separating the film thickness measurement step from the other steps according to the present invention, it becomes possible to apparently shorten the film thickness measurement tact time. Further, the use of the first threshold number can place restrictions on the precedent execution of the pre-polishing film thickness measurement step, thereby preventing exclusive use of the ITM 23 for the pre-polishing film thickness measurement step. The use of the second threshold number can correct distortion in the entire process (feedback delay) caused by the separation of the film thickness measurement step from the other steps. That is, the first threshold number and the second threshold number function to rectify distortion in the entire process due to the separation of the film thickness measurement step from the other steps.

While the present invention has been described with reference to the embodiments thereof, it will be understood by those skilled in the art that the present invention is not limited to the particular embodiments described above, but it is intended to cover modifications within the inventive concept.

What is claimed is:

1. A polishing method comprising:
  a substrate storing step of storing a plurality of substrates in a cassette;
  a pre-polishing film thickness measurement step of taking an unpolished substrate requiring pre-polishing film thickness measurement out of the cassette before polishing and measuring a thickness of a pre-polishing film of the unpolished substrate with a film thickness measurement device, the unpolished substrate being one of the substrates stored in the cassette:

a pre-polishing substrate withdrawal step of returning the unpolished substrate after the pre-polishing film thickness measurement to the cassette;

a polishing step of taking a selected substrate out of the cassette and polishing the selected substrate, the selected substrate being one of the substrates stored in the cassette, the substrates stored in the cassette including the unpolished substrate which has undergone the pre-polishing film thickness measurement step and then been returned to the cassette;

a cleaning/drying step of cleaning and drying the selected substrate after polishing;

a post-polishing substrate withdrawal step of returning the selected substrate to the cassette after cleaning/drying; and a post-polishing film thickness measurement step of taking a post-polished substrate requiring post-polishing film thickness measurement out of the cassette and measuring a thickness of a post-polished film of the post-polished substrate with the film thickness measurement device, the post-polished substrate being one of the substrates stored in the cassette.

2. The polishing method according to claim 1, wherein the film thickness measurement device preferentially carries out the post-polishing film thickness measurement step when the number of substrates from the pre-polishing film thickness measurement step to the pre-polishing substrate withdrawal step is not less than a predetermined first threshold number.

3. The polishing method according to claim 2, wherein when the number of substrates after the cleaning/drying step and before the post-polishing film thickness measurement step is not less than a predetermined second threshold number, the post-polishing substrate withdrawal step for the substrate after the cleaning/drying step for which the post-polishing film thickness measurement step is necessary is stopped.

4. A polishing apparatus comprising:

a loading/unloading section having a front loading section to be mounted with a cassette in which substrates are housed;

a polishing section having a holder for holding a substrate and pressing the substrate against a polishing surface while moving the substrate relative to the polishing surface, thereby polishing the substrate;

a cleaning/drying section for cleaning and drying the substrate after polishing;

a film thickness measurement device for measuring a thickness of a polishing film of the substrate before polishing and after polishing and cleaning/drying; and a transfer device configured to:

remove an unpolished substrate requiring pre-polishing film thickness measurement from the cassette, and return the unpolished substrate to the cassette after the pre-polishing film thickness measurement, the unpolished substrate being one of the substrates stored in the cassette;

remove a selected substrate from the cassette for polishing, cleaning, and drying, the selected substrate being one of the substrates stored in the cassette, the substrates including the unpolished substrate which has undergone the pre-polishing film thickness measurement and then been returned to the cassette, and return the selected substrate to the cassette after the polishing, cleaning, and drying; and remove a post-polished substrate requiring post-polishing film thickness measurement from the cassette, and return the post-polished substrate to the cassette after the post-polishing film thickness measurement, the post-polished substrate being one of the substrates stored in the cassette.

5. The polishing apparatus according to claim 4, wherein when the number of substrates after the pre-polishing film thickness measurement with the film thickness measurement device and before polishing in the polishing section is not less than a predetermined first threshold number, the film thickness measurement device preferentially measures a thickness of a polishing film of a substrate after polishing and cleaning/drying, which has been returned to the cassette.

6. The polishing apparatus according to claim 5, wherein when the number of substrates after polishing and cleaning/drying and before the post-polishing film thickness measurement with the film thickness measurement device, which has been returned to the cassette, is not less than a predetermined second threshold number, the transfer device stops transferring to the cassette a substrate after polishing and cleaning/drying for which the post-polishing film thickness measurement is necessary.

7. A program embodied on a non-transitory computer readable medium for controlling a polishing apparatus: said program for causing a computer to control the polishing apparatus including a loading/unloading section having a front loading section to be mounted with a cassette in which substrates are housed; a polishing section having a holder for holding a substrate and pressing the substrate against a polishing surface while moving the substrate relative to the polishing surface, thereby polishing the substrate; a cleaning/drying section for cleaning and drying the substrate after polishing; a film thickness measurement device for measuring a thickness of a polishing film of the substrate before polishing and after polishing and cleaning/drying; and a transfer device for transferring the substrate; the polishing apparatus being controlled by the computer to execute the steps of:

removing an unpolished substrate requiring pre-polishing film thickness measurement from the cassette, and returning the unpolished substrate to the cassette after the pre-polishing film thickness measurement, the unpolished substrate being one of the substrates stored in the cassette;

removing a selected substrate from the cassette for polishing, cleaning, and drying, the selected substrate being one of the substrates stored in the cassette, the substrates including the unpolished substrate which has undergone the pre-polishing film thickness measurement and then been returned to the cassette, and returning the selected substrate to the cassette after the polishing, cleaning, and drying; and removing a post-polished substrate requiring post-polishing film thickness measurement from the cassette, and returning the post-polished substrate to the cassette after the post-polishing film thickness measurement, the post-polished substrate being one of the substrates stored in the cassette.

8. The program for controlling a polishing apparatus according to claim 7, wherein when the number of substrates after the pre-polishing film thickness measurement with the film thickness measurement device and before polishing in the polishing section is not less than a predetermined first threshold number, said program causes the computer to execute the step of preferentially measuring a thickness of a polishing film of a substrate after polishing and cleaning/drying, which has been returned to the cassette, with the film thickness measurement device.

9. The program for controlling a polishing apparatus according to claim 8, wherein when the number of substrates after polishing and cleaning/drying and before the post-polishing film thickness measurement with the film thickness measurement device, which has been returned to the cassette, is not less than a predetermined second threshold number, said program causes the computer to execute the step of stopping transferring to the cassette by the transfer device a substrate after polishing and cleaning/drying for which the post-polishing film thickness measurement is necessary.

* * * * *